United States Patent [19]

Nakamura

[11] Patent Number: 5,382,539
[45] Date of Patent: Jan. 17, 1995

[54] METHOD FOR MANUFACTURING A SEMICONDUCTOR DEVICE INCLUDING NONVOLATILE MEMORIES

[75] Inventor: Takashi Nakamura, Kyoto, Japan
[73] Assignee: Rohm Co., Ltd., Kyoto, Japan
[21] Appl. No.: 936,094
[22] Filed: Aug. 26, 1992
[30] Foreign Application Priority Data
Oct. 31, 1991 [JP] Japan .................. 3-286683
[51] Int. Cl.⁶ ........................... H01L 21/70
[52] U.S. Cl. ..................... 437/52; 437/43; 437/48
[58] Field of Search .......... 437/43, 48, 52; 365/145, 185; 257/295, 324

[56] References Cited
U.S. PATENT DOCUMENTS

| | | | |
|---|---|---|---|
| 3,731,163 | 5/1973 | Shuskus | 257/324 |
| 4,804,637 | 2/1989 | Smayling et al. | 437/43 |
| 4,949,309 | 8/1990 | Rao | 365/104 |
| 5,047,981 | 9/1991 | Gill et al. | 365/185 |
| 5,128,895 | 7/1992 | Park | 365/185 |
| 5,183,773 | 2/1993 | Miyata | 437/43 |

*Primary Examiner*—Tom Thomas
*Attorney, Agent, or Firm*—Christopher R. Pastel; Thomas R. Morrison

[57] ABSTRACT

A method for manufacturing a semiconductor device having a diffusion region formed within a source. A one-conductivity type well is created in a semiconductor substrate, and marked off with field oxide layers. An insulating layer for holding charges is formed on a portion of the surface of the one-conductivity type well, onto which a conductive layer is applied. The insulating layer and the conductive layer are both etched to produce a memory charge storage and a control gate electrode, respectively. An opposite-conductivity type drain and source are formed in the one-conductivity type well. A one-conductivity type diffusion region is then formed within the opposite-conductivity type source, resulting in a memory cell having superior reliability.

2 Claims, 10 Drawing Sheets

METHOD FOR MANUFACTURING A SEMICONDUCTOR DEVICE INCLUDING NONVOLATILE MEMORIES

BACKGROUND OF THE INVENTION

1. Field of the Invention

The present invention relates to a semiconductor nonvolatile memory and, more particularly, to improvement in its integration.

2. Description of the Prior Art

There is shown an instance of semiconductor nonvolatile memory which utilize the ferroelectric properties: reversible polarization and remanance. This ferroelectric nonvolatile memory comprises many switch elements 1. FIG. 1 shows the switch element 1 in section.

Referring to FIG. 1, the switch element 1 has a P type silicon substrate 10 including a N+ type source 8 and a N+ type drain 6, the two regions forming a channel region 9. On top of the channel region 9 there is formed a ferroelectric film 4. Further, on top of the ferroelectric film 4 there is formed a gate electrode 2 comprised of aluminum or the like.

A logic "1" can be written into and erased from the above-mentioned switch elements 1 by electricity. Accordingly, the switch elements 1 have two stable states: one in which a logic "1" has been written therein, and the other in which the logic "1" has been erased and a logic "0" has been stored. The fact that the switch elements 1 can take these two stable states is utilized to fabricate a memory.

FIG. 2 shows hysteresis loop which the switch elements 1 exhibits. Referring to FIG. 2, the vertical axis represents polarization P and horizontal axis represents electric field E. There will be described the process by which the logic "1" is written into and erased from the switch element 1 with reference to FIG. 2.

In order to write a logic "1" into switch elements 1, ground potential is applied to the substrate 10 and more programming voltage than positive coercive voltage Ec is applied to the control electrode 2. Incidently, the coercive voltage Ec is the lowest positive possible voltage applied to the control electrode 2 so as to reverse the existing polarization. At that time, an electric field develops between the substrate 10 and the control electrode 2 whereby the ferroelectric film 4 is polarized into a direction parallel to the electric field, as symbolized by point P1 in FIG. 2. In addition, this polarization will remain in this state even if the gate voltage is cut off, as symbolized by point Q1 in FIG. 2.

This status in polarization of the ferroelectric film 4 indicates that a logic "1" has been written into the switch element 1. In the switch element 1 having the logic "1", the channel region 9 is conductive because a portion of the ferroelectric film near the control electrode 2 is negatively charged and a portion of the ferroelectric film 4 near the substrate 10 is positively charged.

On the other hand, in order to erase the logic "1" from the switch element 1 or to write a logic "0" therein, ground potential is applied to the substrate 10 and less programming voltage than negative coercive voltage −Ec is applied to the control electrode 2.

At that time, an electric field of the polarity opposite to that used when writing the logic "1" between the substrate 10 and the control electrode 2 is applied, whereby the ferroelectric film 4 is polarized into the direction parallel to the electric field, as symbolized by point R1 in FIG. 2. In addition, this polarization will remain in this state even if the gate voltage is cut off, as symbolized by point S1 in FIG. 2.

This status in polarization of the ferroelectric film 4 indicates that the logic "1" has been erased or a logic "0" has been written into the switch element 1. In the switch element 1 with the logic "0", the channel region 9 is nonconductive because a portion of the ferroelectric film 4 near the control electrode 2 is positively charged and a portion of the ferroelectric film near the substrate is negatively charged.

The operation of reading information from the switch element 1 will be described below. It is determined whether the switch element 1 has a logic "0" or a logic "1", by determining whether or not a current flows through the channel region 9 when stable voltage is applied between the source 8 and the drain 6 of the switch element 1.

An example of a memory circuit constructed using the aforementioned switch elements 1 is conceptually shown in FIG. 3.

A memory cell array A has 32 by 32, i.e. 1024 memory cells (1K bits) arranged in matrix form. To the drain 6 of each switch element 1 is connected the source of row select transistor 7. A row decoder 40 drives word lines WL which are each connected to the control electrodes of the switch elements 1. Select control lines SL are each connected to the gate electrodes of the row select transistors 7 to assist in writing and erasing data to the array. A column decoder 38 drives column data lines DLs which are each connected to the drain of each row select transistor 7.

The way in which information is written into a switch element 1 will be described with reference to FIG. 3. To write a logic "1" into a switch element $1_{m,n}$ at column m and row n, programming voltage $V_{pp}$ grater than positive coercive voltage is applied only to the control electrode 2 of the switch element $1_{m,n}$ relative the drain 6 thereof. This is effected by applying the programming voltage $V_{pp}$ to only the word line WLn with the low decoder 40, applying a voltage $V_{dd}$ to only the Select control line SLn, applying ground voltage equal in potential to the substrate 10 to the data line DLm and applying a programming inhibit voltage Vi to all data lines except the data line DLm. This potential difference $V_{pp}$ polarizes the ferroelectric film 4 of the switch element $1_{m,n}$ into a direction parallel to the electric field developed thereby.

As is described above, the logic "1" will be written into only the switch element $1_{m,n}$.

The way in which the logic "1" stored in the switch element $1_{m,n}$ is erased and changed into a logic "0" will be described with reference to FIG. 4. The construction shown in FIG. 4 is the same as shown in FIG. 3. To erase the logic "1" stored in the switch element $1_{m,n}$, an electric field of opposite polarity to that produced when writing the logic "1" is required between its control electrode 2 and its drain 6. This is effected by applying the voltage $V_{pp}$ to only the data line DLm with the column decoder 38, applying the voltage $V_{dd}$ to only the Select control line SLn and applying ground voltage equal in potential to the substrate 10.

This potential difference $V_{pp}$ polarizes the ferroelectric film 4 of the switch element $1_{m,n}$ into a direction parallel to the electric field developed thereby. As is described above, the logic "1" will be erased from only the switch element $1_{m,n}$.

The method of operation for reading information from the switch element $1_{m,n}$ will be described below with reference to FIG. 5. The construction shown in FIG. 5 is the same as shown in FIG. 3. In order to read data stored in the switch element $1_{m,n}$, it is necessary to determine which logic is stored in the switch element $1_{m,n}$ and output the result.

More specifically, in reading operation, the voltage $V_{dd}$ is applied to only the line SLn among Select control lines SL and the data line DLm has the voltage $V_{dd}$ applied to it through a resistor 43. The source 8 of the switch element $1_{m,n}$ is grounded. As a result, there is a potential difference $V_{dd}$ between the source 8 and the drain 6 because the row select transistors $7_{m,n}$, which are connected with the Select control line SLn, have a conductive channel formed between the source and the drain. The current flowing through data line $DL_m$ is directed to ground via the conductive switch element $1_{m,n}$ on condition that the switch element has the logic "1" stored. This occurs because the channel region 9 of the switch element $1_{m,n}$ is conductive. As a result, the column decoder 38 has no input of current from the data line DL.

Conversely, the current flowing through data line DLm is not conducted to ground through the switch element $1_{m,n}$ and is therefore inputted into the column decoder 38 without loss to ground on condition that the switch element has the logic "0" stored. This occurs because the channel region of the switch element is nonconductive.

The column decoder 38 is arranged to output only the current from the data line $DL_m$. This output is amplified and read by the sense amplifier 42. In the FIG. 5, the voltage $V_{dd}$ is applied the rest of data lines through the resistor 43 for the case where data are read from the other switch elements 1 at same time.

With progress of the semiconductor industry, a need has arisen for nonvolatile semiconductor memories which can be miniaturized and integrated. In response to this need, construction of a memory circuit has been attempted using only the aforementioned switch elements 1 without the row select transistors 7.

However, this memory circuit comprising one-transistor cells have the following problems. A conceptual view of the memory circuit comprising one-transistor cells is shown in FIG. 6. FIG. 6 shows four switch elements 1A, 1B, 1C and 1D arrayed in row by column. Drains of switch elements 1 arrayed in a row are each connected to a drain line and sources of switch elements 1 arrayed in a column are connected to a data line. Also, control electrodes of switch elements 1 arrayed in a column are each connected to a word line.

In order to read the information from the switch element 1A of the memory circuit, it is necessary to make the current flowing on only the data line 12, apply ground potential to only the drain line 20 and apply the same potential as the data line 12 to the rest of drain lines except the drain line 20, after setting all word lines to ground potential. It is determined whether the switch element 1 has a logic "0" or a logic "1", by determining whether or not there is decrease in potential of the word line 12 when the above-mentioned reading operation is performed. More Specifically, when the switch element 1 has the logic "1" stored, there is decrease in potential of the word line 12. Conversely, when the switch element 1 have the logic "0" stored, there is not decrease in potential of the word line 12.

However, when the switch element 1A has the logic "0" and the switch elements 1B, 1C and 1D have the logic "1" (that is, the switch element 1A is nonconductive and the switch elements 1B, 1C and 1D are conductive), there is a decrease in potential of the word line 12 in spite of the fact that the switch element 1A is nonconductive. This is because the current flowing through the data line 12 is directed to ground via the line symbolized as the thick exiting line. Such a misreading is possible in the memory circuit comprising the one-switch element 1.

For the above reason, the memory circuit comprising the one-switch element 1 has not been implemented.

SUMMARY OF THE INVENTION

Accordingly, it is an object of the present invention to provide a method for manufacturing nonvolatile semiconductor memory that comprises one-transistor cells capable of reading information from a selected memory cell without mistake.

A method for manufacturing a semiconductor device including nonvolatile memories according to an embodiment of the invention comprises the steps of:
preparing a semiconductor substrate,
providing switch elements for the semiconductor substrate so that the switch elements are arrayed in rows and columns,
wherein the switch elements comprises an one-conductivity type drain and an one-conductivity type source, and a control electrode,
creating diffusion regions of the opposite conductivity type in the source and attaching a source electrode to the diffusion region;
providing first lines so that each of the first lines connects to all of the drains of the switch elements arrayed in a row,
providing second lines so that each of the second line connects to all of the source electrodes of the switch elements arrayed in a column, and
providing word lines so that each of the word lines connects to all of the control electrodes of the switch elements arrayed in a colum.

The above, and other objects, features and advantages of the present invention will become apparent from the following description read in conjunction with the accompanying drawings, in which like reference numerals designate the same elements.

DETAILED DESCRIPTION OF THE INVENTION

Figure 1:
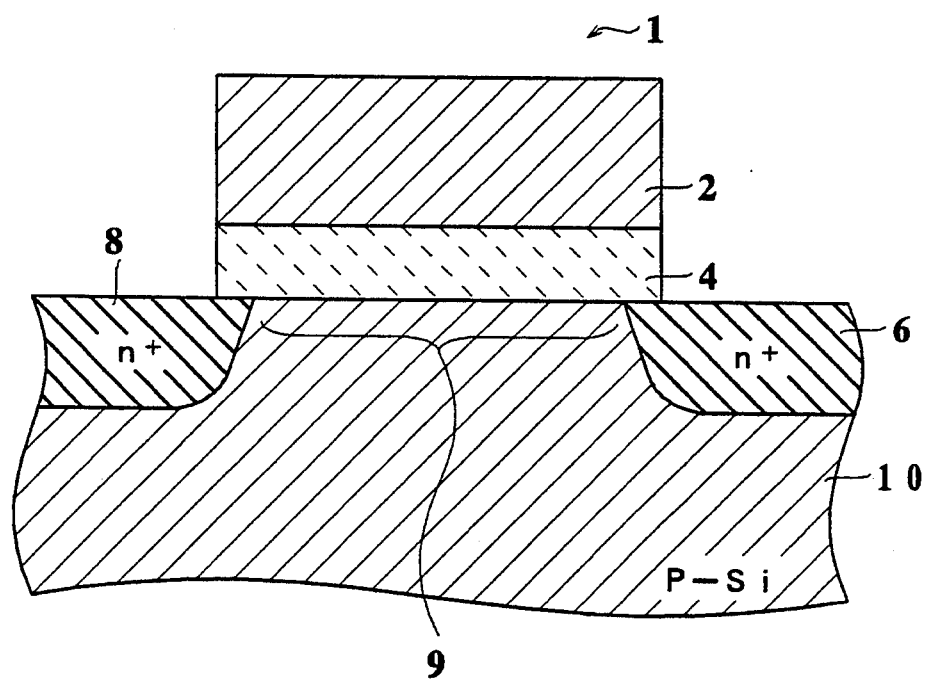
FIG. 1 is a view schematically showing the construction in section of a switch element 1 according to prior art.
Figure 2:
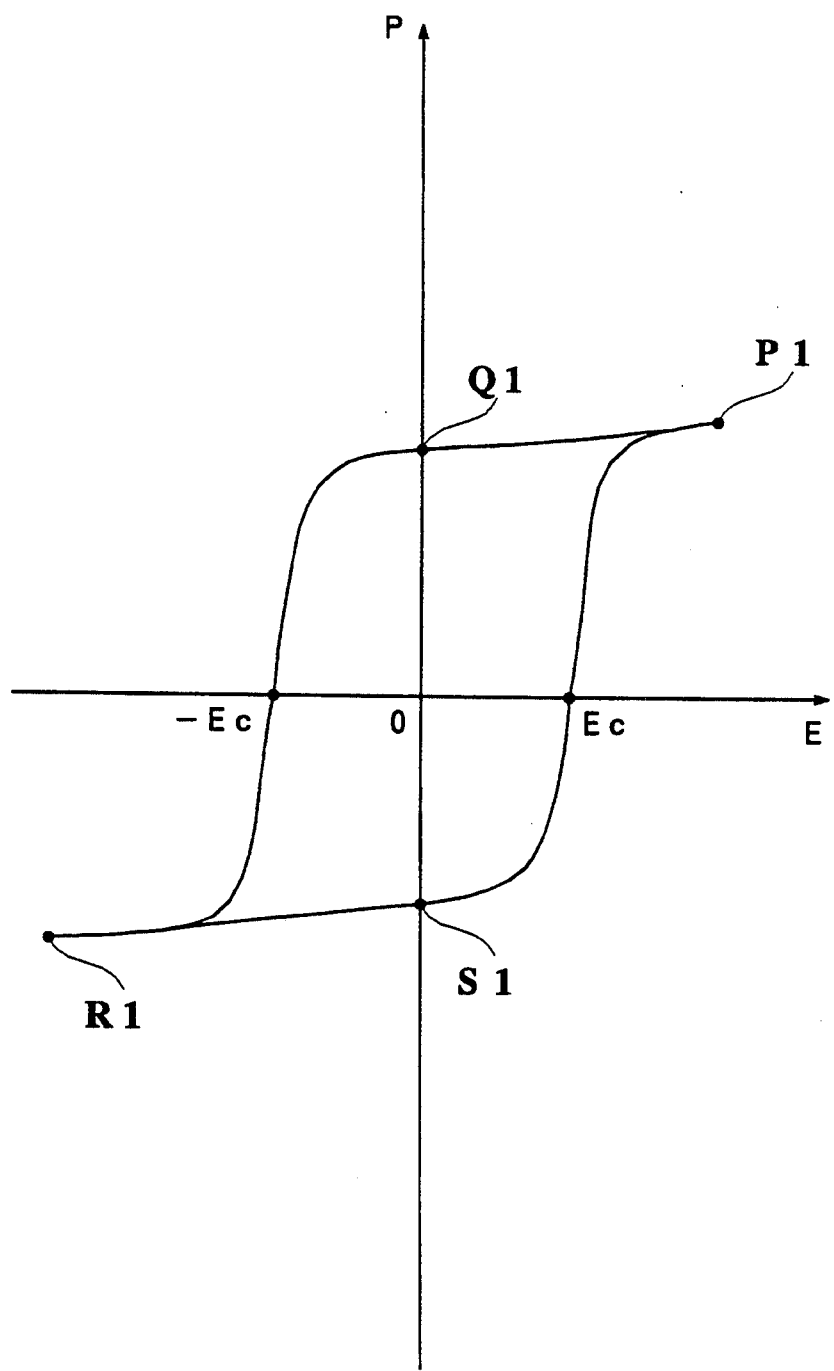
FIG. 2 is a view showing the hysteresis loop for threshold voltage of the switch element 1.
Figure 3:
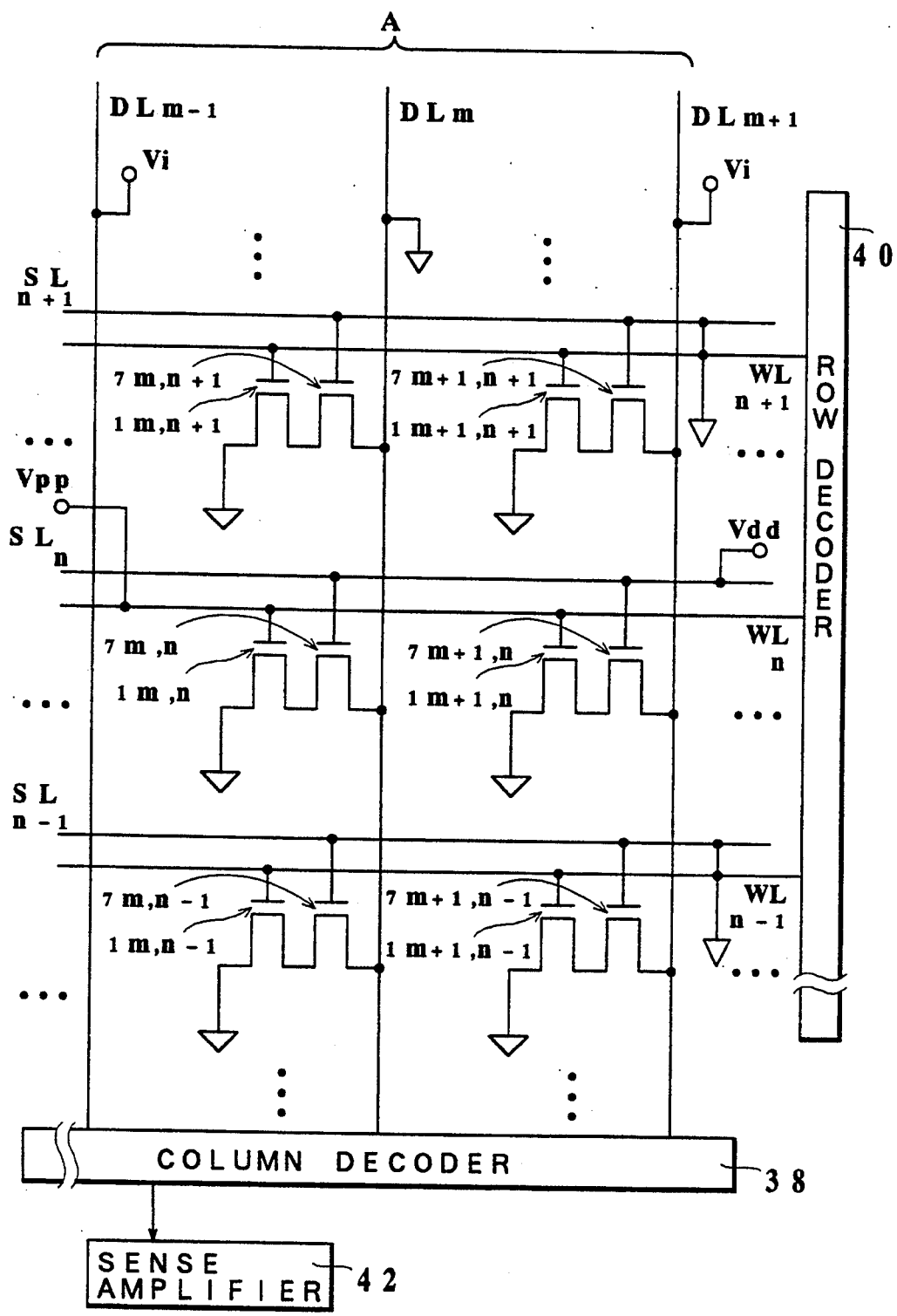
FIG. 3 is a conceptual view showing the construction of a conventional memory circuit for explaining the principle of writing information into switch elements 1.
Figure 4:
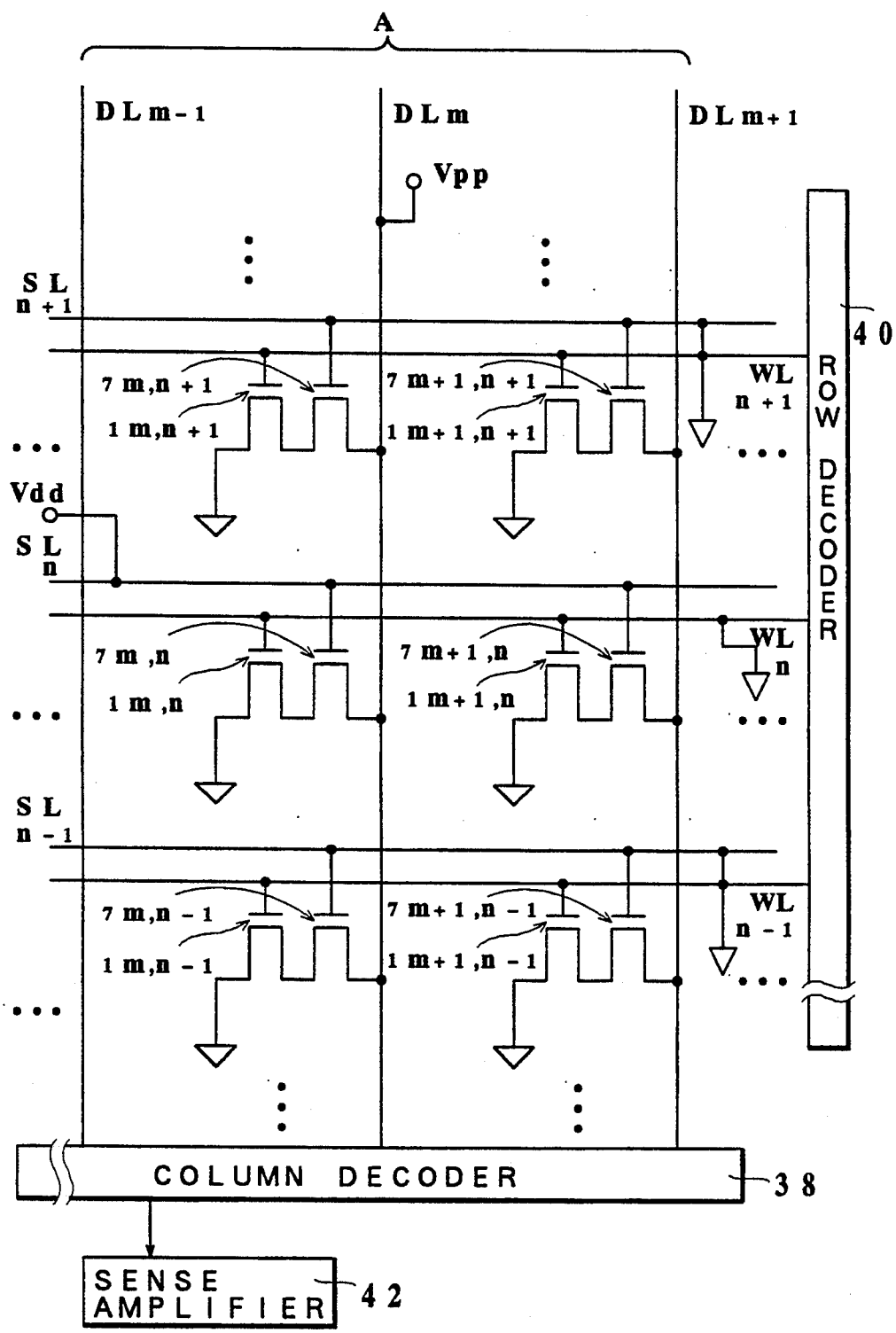
FIG. 4 is a conceptual view showing the construction of a conventional memory circuit for explaining the principle of reading information from switch elements 1.
Figure 5:
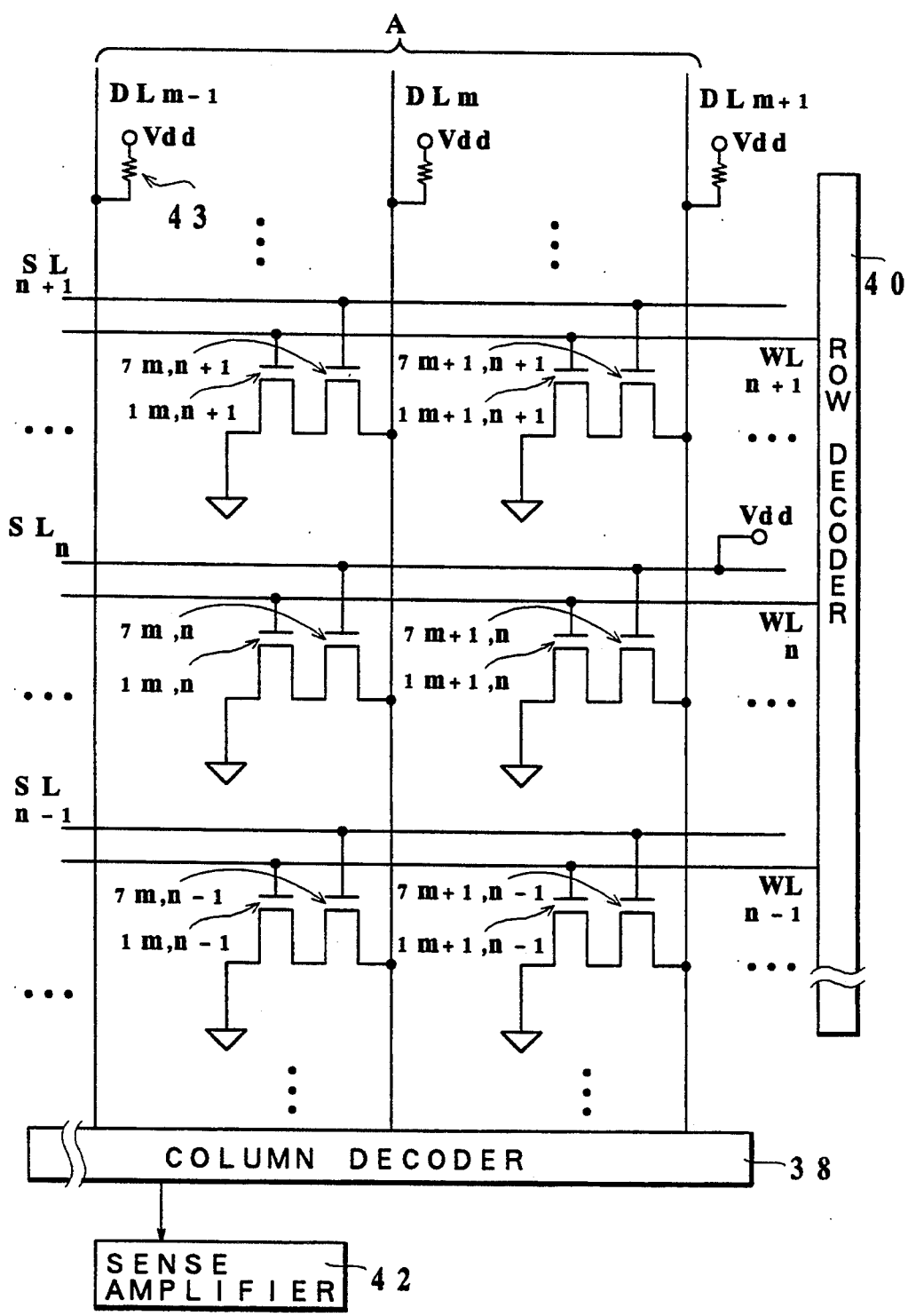
FIG. 5 is a conceptual view showing the construction of a conventional memory circuit for explaining the principle of erasing information stored in switch elements 1.
Figure 6:
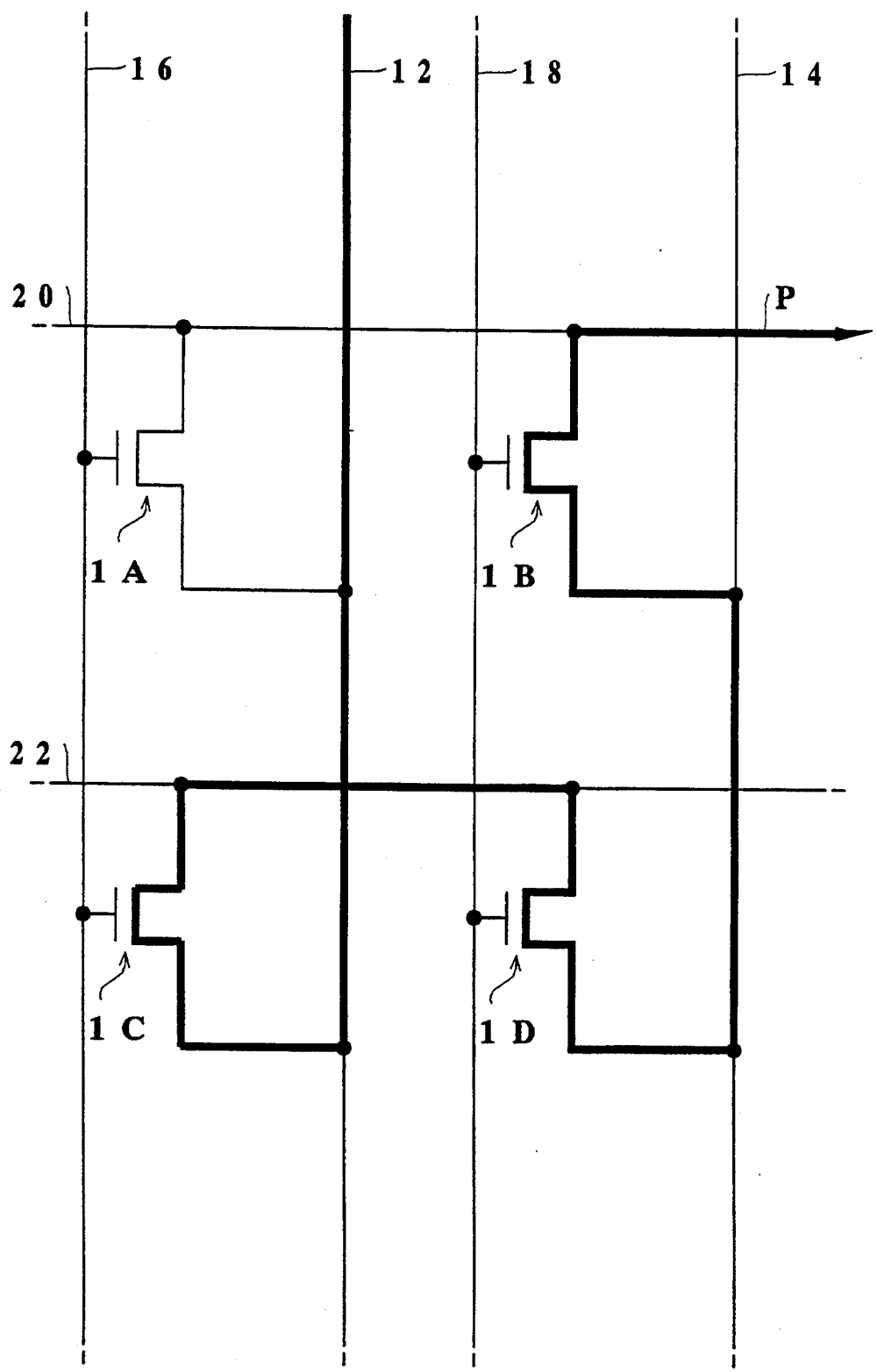
FIG. 6 is a conceptual view explaining the disadvantage of the construction of a memory circuit comprising one-transistor cells using the switch elements 1.
Figure 7:
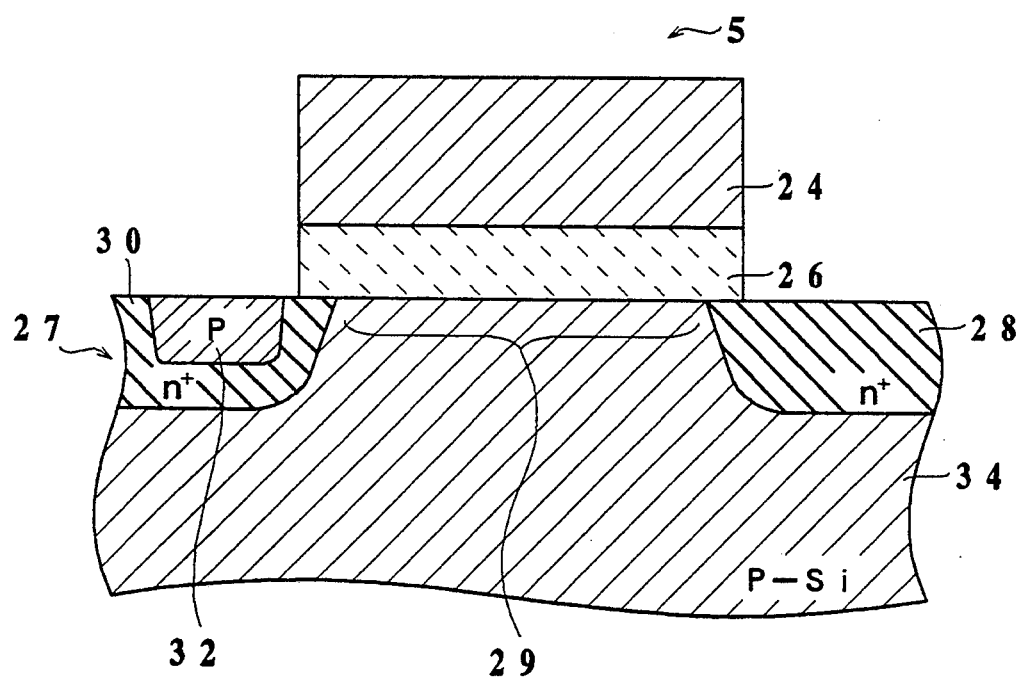
FIG. 7 is a view schematically showing the construction in section of a memory cell according to an embodiment of the present invention.

A memory cell 5 according to an embodiment of the present invention is shown in schematic section in FIG. 7.

The memory cell 5 has a switch element 3 and a diode 27. The switch element 3 is the field effect transistor structure. As is shown FIG. 7, the switch element 3 has a P type well 34 including a N+ type (one-conductivity type) source 30 and a N+ type (one-conductivity type) drain 28, the two regions forming a channel region 29. On top of the channel region 29 there is formed ferroelectric film 26. Further, on top of ferroelectric film 26 there is formed a layer 24 made of platinum 24 acting as a control electrode.

The diode 27 is a junction between the N+ type source 30 and a P (the-opposite-conductivity type) diffusion region 32 formed within the source 30.

Because the switch element 3 is the same in construction as the switch element 1, a logic "1" can be written into and erased from the above-mentioned switch elements by electricity. Accordingly, the switch elements 3 has two stable states: one in which a logic "1" has been written therein, and the other in which the logic "1" has been erased and a logic "0" has been stored. The switch elements with the logic "1" have a conductive channel region. Conversely, the switch elements with the logic "0" have a nonconductive channel region. The fact that the switch elements 1 can take these two stable states is utilized to fabricate a memory.

Figure 8:
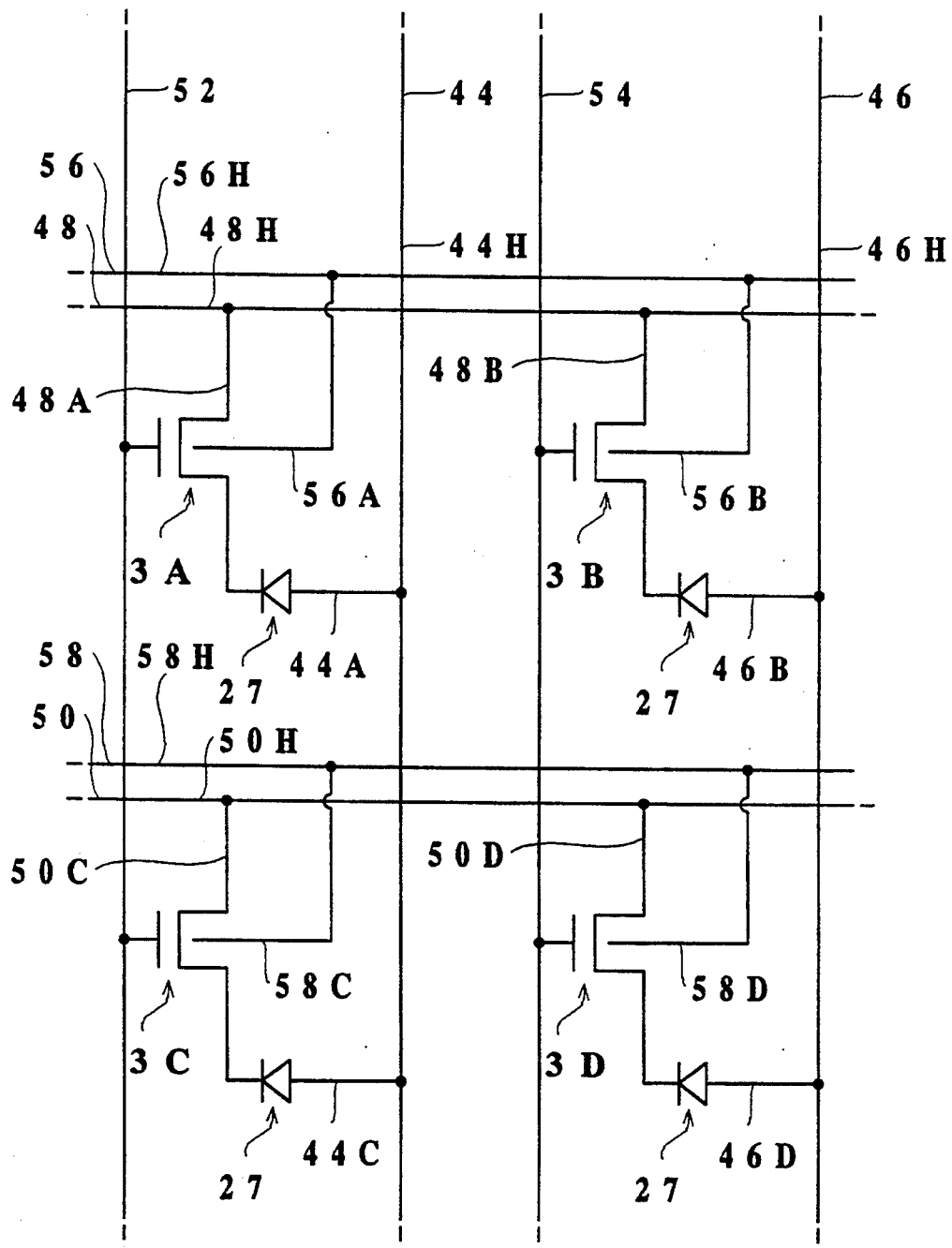
FIG. 8 is a conceptual view showing the construction of a memory circuit comprising one-transistor cells according to an embodiment of the present invention.

Next, an example of memory circuit constructed using the aforementioned switch elements 1 is conceptually shown in FIG. 8. FIG. 8 shows four switch elements 1A, 1B, 1C and 1D arrayed in rows by column.

Data lines 48 and 50 serves as first line. A data line 48 consists of a main line 48H and subsidiary lines 48A and 48B diverging from the main line 48H. The subsidiary lines 48A and 48B connects to the drain of the switch element 3A and 3B, respectively. A data line 50 consists of a main line 50H and subsidiary lines 50C and 50D diverging from the main line 50H. The subsidiary lines 50C and 50D connect to the drain of the switch element 3C and 3D, respectively.

Source lines 44 and 46 serves as second line. A source line 44 consists of a main line 44H and subsidiary lines 44A and 44C diverging from the main line 44H. The subsidiary lines 44A and 44C connects to P type diffusion layers 32 of the switch elements 3A and 3C via a source electrode, respectively. A data line 46 consists of a main line 46H and subsidiary lines 46B and 46D diverging from the main line 46H. The subsidiary lines 46B and 46D connect to P type diffusion layers 32 of the switch elements 3B and 3D via a source electrode, respectively.

This configuration shows that a diode is interposed in the subsidiary line connecting to the source of each of the switch elements.

A bit line 56 consists of a main line 56H and subsidiary lines 56A and 56B diverging from the main line 56H. The subsidiary lines 56A and 56B connects to the well of the switch elements 3A and 3B, respectively. A bit line 58 consists of a main line 58H and subsidiary lines 58C and 58D diverging from the main line 58H. The subsidiary lines 58C and 58D connect to the well of the switch elements 3C and 3D, respectively. A word line 52 connects to the control electrode of the switch elements 3A and 3C. A word line 54 connects to the control electrode of the switch elements 3B and 3D.

The way in which information is written into the memory circuit will be described with reference to FIG. 8. The logic "1" can be written into a selected memory cell in the following way. To write the logic "1" into, for example, a switch element 3A, programming voltage $V_{pp}$ enough to polarize the ferroelectric film 26 is applied to the word line 52. The bit line 56 is set to ground potential and the bit line 58 is left floating. The other lines, or the word line 54, the source lines 44 and 46, and the data lines 48 and 50 can be either at ground potential or left floating. Noted that both the word line 52 and the data line 50 is preferably left floating in order to keep low level of voltage applied to the ferroelectric film 26 of the non-selected switch elements.

Next, the way in which only a stored logic "1" is erased (changed into a logic "0") will be described with reference to FIG. 8. The logic "1" can be erased from a selected switch element in the following way. To erase the logic "1" stored in, for example, the switch element 3A, the programming voltage $V_{pp}$ is applied to the bit line 56. The word line 52 is set to ground potential. The bit line 58 and the word line 54 are left floating so as not to change a logic stored in non-selected switch elements. The source lines 44 and 46 are set to ground potential. The data line 48 is at potential difference $V_{pp}$ and the data line 50 is left floating.

The method of operation for reading information from the memory circuit will be described below with reference to FIG. 8. Data can be read from a selected switch element as follows. To read data stored in, for example, the switch element 3A, when less voltage SA than the positive coercive voltage is applied to the source line 44, judgment of which logic is stored in the switch element $1_{m,n}$ is determined by whether or not there is decrease in potential of the data line 48.

It is noted the voltage SA is applied to the data line 50 so as not to leak the current flowing through the source line 44 and applied to the word line 52 in order to stabilize an existing state in the switch element 3A. The bit lines 56 and 58 set at the potential equal to The voltage SA so as not to change state in polarization of the non-selected switch elements.

The diode provided for each of the switch elements can prevent the current flowing through the source line 44 from leaking when the switch element 1A have the logic "0" and the switch elements 1B, 1C and 1D have the logic "1" (that is, the switch element 1A is nonconductive and the switch elements 1B, 1C and 1D are conductive).

As is described above, the memory circuit constructed using one-transistor cell is capable of writing into, erasing from and reading out of a selected switch element.

The manufacturing process for the switch elements according to an embodiment of a method for manufacturing the semiconductor device including nonvolatile memories will be described below with reference to FIGS. 9A, 9B and FIGS. 10A, 10B.

Figure 9:
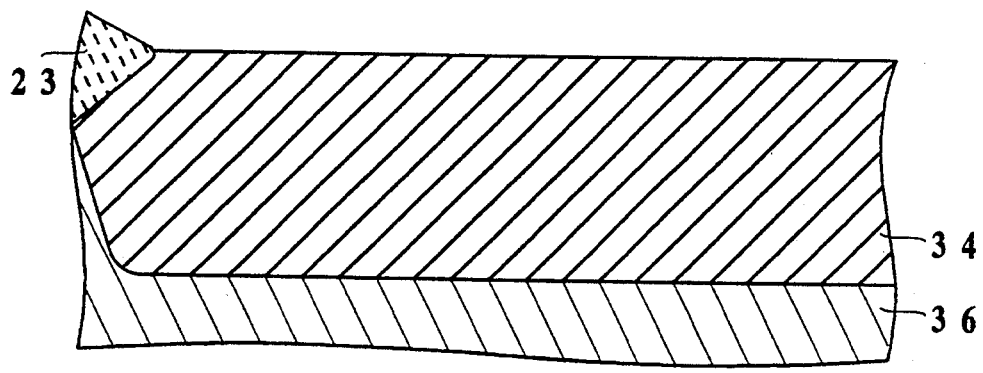
FIGS. 9A and 9B are views showing the manufacturing process of the memory cell.
Figure 9:
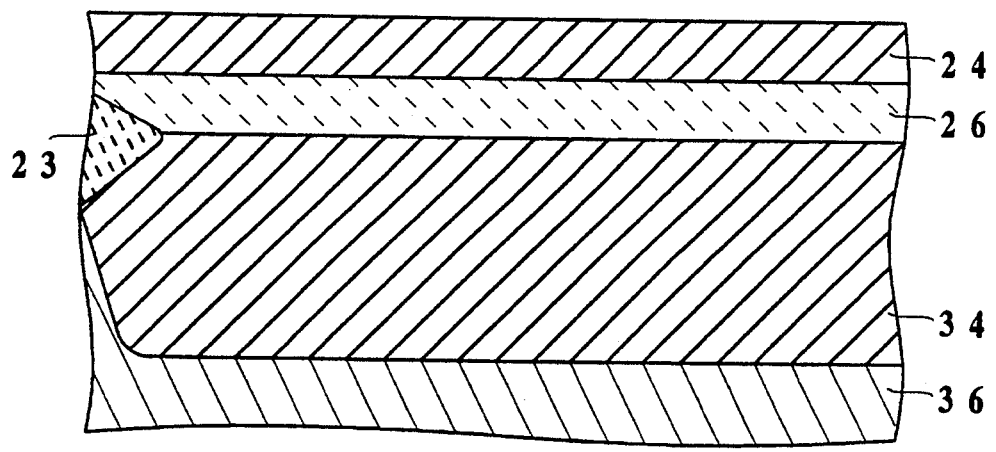

Referring to FIG. 9A, within the N type silicon substrate 36 which is a semiconductor substrate, there is provided a P type silicon well 34 of a one-conductivity type, the P type silicon well 34 being marked off with field oxide layers 23.

Referring to FIG. 9B, on top of the silicon well 34, a ferroelectric layer 26 make of $PbTiO_3$ which is an insulating layer for holding charges, is formed by RF(radio frequency) deposition sputtering and heat treatment for several hours. Preferred conditions are as follows. Target diameter is 80 mm, target substrate space is 35 mm, target PR voltage is 1.6 kV, sputtering power is 150 W, sputtering gas consists of Ar and $O_2$ (Ar:$O_2$=9:1), gas pressure is $2\times10^{-2}$ torr., temperature of the substrate is 400° to 500° C. and the sputtering rate is 3 nm per minute. The target requires an extra 10 wt % of Pb to compensate for a deficiency of Pb in the deposited film. The temperature of substrate is maintained at 400° C. during sputtering and 500° C. during heat treatment. On top of the ferroelectric film 26, a conductive platinum layer 24 is formed by sputtering deposition.

Figure 10:
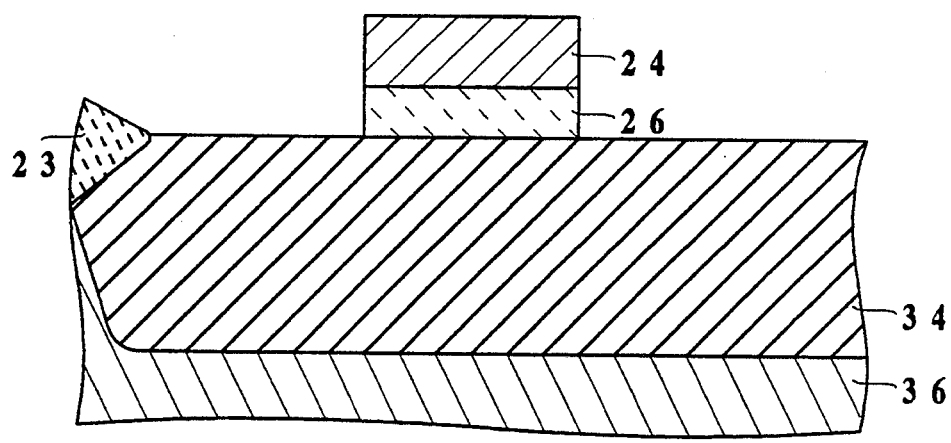
FIGS. 10A is 10B are views showing the manufacturing process of the memory cell.
Figure 10:
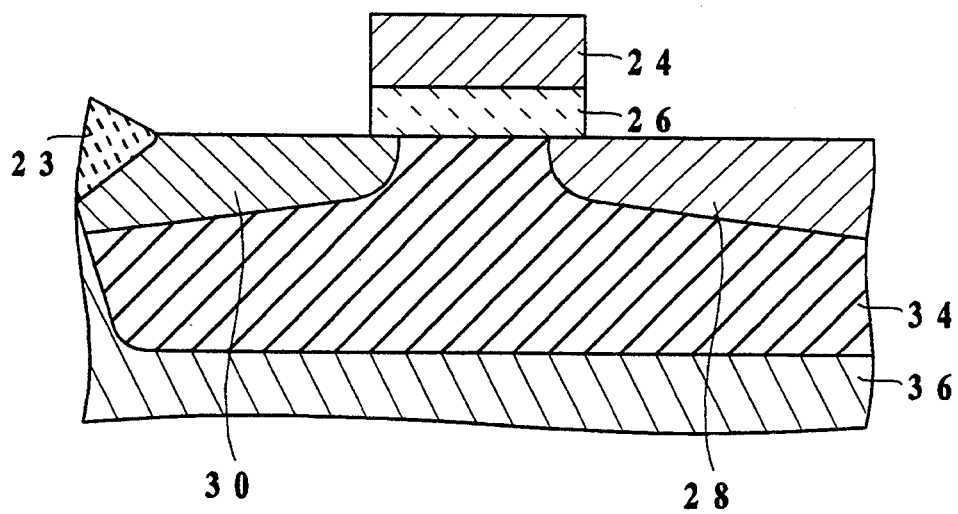

Referring to FIG. 10A, the resulting structure is then subjected to etching using resist as a mask (not shown), to form a platinum layer 24 which is a control gate electrode and the ferroelectric film 26 which is a memory charge storage.

Referring to FIG. 10B, arsenic or phosphorus is then ion-implanted and thermally diffused to form a N+ drain 28 which is an opposite-conductivity type drain and a N+ source 30 which is an opposite-conductivity type source.

P type dopant is then ion implanted and thermally diffused to form a P type diffusion layer 32 which is a one-conductivity type diffusion region within the source 30 as shown in FIG. 7.

Thereafter, a source electrode and a drain electrode are attached to the diffusion layer 32 and the drain 28, respectively. This completes the writing of memory cells. Then the memory cells are covered with an insulating layer (not shown).

Thereafter, a source electrode and a drain electrode are attached to the diffusion layer 32 and the drain 28, respectively, and wiring among memory cells is completed. The memory cells are then covered with an insulating layer (not shown).

Although in the preferred embodiment the memory circuit is constructed using the switch elements which utilize ferroelectric properties, in alternative embodiments a memory circuit may be constructed using a switch element of either MNOS-type or floating type.

Although in the preferred embodiment one-conductivity type has been assumed to be N type and the-opposite-conductivity type to be P type, in alternative embodiments one-conductivity type may also be P type and the-opposite-conductivity type may be N type.

The nonvolatile semiconductor memory according to the present invention is characterized in that the memory comprises switch elements which are arrayed in rows and columns, each of the switch element having a drain and a source, and a control electrode, first lines each of which includes a main line and subsidiary lines diverging from the main line, each of the subsidiary lines connecting to the drain of one of the switch elements arrayed in a row, second lines each of which includes a main line and subsidiary lines diverging from the main line, each of the subsidiary lines connecting to the source of one of the switch elements arrayed in a column, word lines each of which connects to all of the control electrodes of the switch elements arrayed in a column, and a diode interposed either in the subsidiary line connecting to the drain of each of the switch elements or in the subsidiary line connecting to the source of the same switch element.

Therefore, the present invention provides a nonvolatile semiconductor memory that comprises one-transistor cells and yet is capable of reading information from a selected memory cell without mistake.

Although the present invention has been fully described by way of example with reference to the accompanying drawings, it is to be noted here that various changes and modifications will be apparent to those skilled in the art. Therefore, unless such changes and modifications depart from the scope of the present invention as defined by the appended claims, they should be construed as included therein.

What is claimed is:

1. A method for manufacturing switch elements of a semiconductor device including nonvolatile memories comprising:

creating a well region in a semiconductor substrate, said well region being of a one-conductivity type;

forming field oxide layers at a boundary of said well region;

forming an insulating layer for holding charges on a surface of said well region;

said insulating layer for holding charges being a ferroelectric layer;

forming a conductive layer on a surface of said insulating layer for holding charges;

etching said insulating layer for holding charges and said conductive layer to form a memory charge storage and a control gate electrode respectively;

forming a drain and a source in said well region, said drain and said source being of an opposite-conductivity type opposite said one-conductivity type; and forming a diffusion region of said one-conductivity type within said source.

2. A method for manufacturing switch elements of a semiconductor device including nonvolatile memories comprising:

creating a well region in a semiconductor substrate, said well region being of a one-conductivity type;

forming field oxide layers at a boundary of said well region;

forming an insulating layer for holding charges on a surface of said well region;

said insulating layer for holding charges includes an oxide layer and a nitride layer on said oxide layer;

forming a conductive layer on a surface of said insulating layer for holding charges;

etching said insulating layer for holding charges and said conductive layer to form a memory charge storage and a control gate electrode respectively;

forming a drain and a source in said well region, said drain and said source being of an opposite-conductivity type opposite said one-conductivity type; and forming a diffusion region of said one-conductivity type within said source.

* * * * *